(12) United States Patent
Salami et al.

(10) Patent No.: US 8,575,474 B2
(45) Date of Patent: *Nov. 5, 2013

(54) SOLAR CELL CONTACTS CONTAINING ALUMINUM AND AT LEAST ONE OF BORON, TITANIUM, NICKEL, TIN, SILVER, GALLIUM, ZINC, INDIUM AND COPPER

(75) Inventors: Jalal Salami, San Marcos, CA (US); Srinivasan Sridharan, Strongsville, OH (US); Steve S. Kim, Goleta, CA (US); Aziz S. Shaikh, San Diego, CA (US)

(73) Assignee: Heracus Precious Metals North America Conshohocken LLC, West Conshohocken, PA (US)

( * ) Notice: Subject to any disclaimer, the term of this patent is extended or adjusted under 35 U.S.C. 154(b) by 1230 days.

This patent is subject to a terminal disclaimer.

(21) Appl. No.: 11/774,632

(22) Filed: Jul. 9, 2007
(Under 37 CFR 1.47)

(65) Prior Publication Data
US 2009/0101190 A1   Apr. 23, 2009

Related U.S. Application Data

(63) Continuation-in-part of application No. 11/384,838, filed on Mar. 20, 2006, now Pat. No. 8,076,570.

(51) Int. Cl.
*H01L 31/042* (2006.01)
*H01L 31/00* (2006.01)
*H01L 31/18* (2006.01)

(52) U.S. Cl.
USPC ............. 136/256; 136/243; 136/252; 438/48; 438/57; 252/514

(58) Field of Classification Search
USPC ........ 136/243, 252, 256; 252/514; 438/48, 57
See application file for complete search history.

(56) References Cited

U.S. PATENT DOCUMENTS

| 3,900,945 | A |   | 8/1975 | Kay et al. |
| 4,070,517 | A | * | 1/1978 | Kazmierowicz ............. 428/209 |

(Continued)

FOREIGN PATENT DOCUMENTS

| EP | 0468382 A1 | 1/1992 |
| JP | 2003-069056 A | 3/2003 |
| JP | 2005-079143 A | 3/2005 |

OTHER PUBLICATIONS

Krause et al., "Determination of aluminum diffusion parameters in silicon", journal of applied physics, 2002.*

(Continued)

*Primary Examiner* — Jennifer Michener
*Assistant Examiner* — Matthew Martin
(74) *Attorney, Agent, or Firm* — Blank Rome LLP

(57) ABSTRACT

Formulations and methods of making solar cell contacts and cells therewith are disclosed. In general, the invention provides a solar cell comprising a contact made from a mixture wherein, prior to firing, the mixture comprises at least one aluminum source, at least one source of a metal including one or more of boron, titanium, nickel, tin, gallium zinc, indium, and copper, and about 0.1 to about 10 wt % of a glass component. Within the mixture, the overall content of aluminum is about 50 wt % to about 85 wt % of the mixture, and the overall combined content of boron, nickel, tin, silver, gallium, zinc, indium, copper, is about 0.05 to about 40 wt % of the mixture.

15 Claims, 1 Drawing Sheet

(56) References Cited

U.S. PATENT DOCUMENTS

| | | | |
|---|---|---|---|
| 4,088,502 A | | 5/1978 | La Bar |
| 4,163,678 A | | 8/1979 | Bube |
| 4,235,644 A | | 11/1980 | Needes |
| 4,492,813 A | * | 1/1985 | Kausche et al. ............... 136/256 |
| 4,703,553 A | | 11/1987 | Mardesich |
| 4,899,704 A | | 2/1990 | Kronich |
| 5,074,920 A | | 12/1991 | Gonsiorawski et al. |
| 5,178,685 A | | 1/1993 | Borenstein et al. |
| 5,584,941 A | | 12/1996 | Nishida |
| 5,645,765 A | * | 7/1997 | Asada et al. ............. 252/519.51 |
| 5,922,627 A | * | 7/1999 | Nabatian et al. ................ 501/17 |
| 5,928,438 A | | 7/1999 | Salami et al. |
| 5,942,048 A | | 8/1999 | Fujisaki et al. |
| 6,096,968 A | | 8/2000 | Schlosser et al. |
| 6,262,359 B1 | | 7/2001 | Meier et al. |
| 6,402,839 B1 | | 6/2002 | Meier et al. |
| 6,469,243 B2 | | 10/2002 | Yamanaka et al. |
| 6,576,391 B1 | | 6/2003 | Iguchi et al. |
| 6,626,993 B2 | | 9/2003 | Meier et al. |
| 6,692,981 B2 | | 2/2004 | Takato et al. |
| 6,695,903 B1 | | 2/2004 | Kubelbeck et al. |
| 6,710,239 B2 | | 3/2004 | Tanaka |
| 6,737,340 B2 | | 5/2004 | Meier et al. |
| 6,777,716 B1 | | 8/2004 | Yamazaki et al. |
| 6,784,037 B2 | | 8/2004 | Yamazaki et al. |
| 6,784,457 B2 | | 8/2004 | Yamazaki et al. |
| 6,814,795 B2 | | 11/2004 | McVicker et al. |
| 6,825,104 B2 | | 11/2004 | Horzel et al. |
| 6,835,888 B2 | | 12/2004 | Sano et al. |
| 6,909,114 B1 | | 6/2005 | Yamazaki |
| 6,977,394 B2 | | 12/2005 | Yamazaki et al. |
| 7,052,824 B2 | * | 5/2006 | Keusseyan .................... 430/313 |
| 7,435,361 B2 | * | 10/2008 | Carroll et al. ................. 252/514 |
| 2002/0005507 A1 | * | 1/2002 | Matsumoto .................... 252/500 |
| 2004/0116268 A1 | | 6/2004 | Kobayashi et al. |
| 2005/0172996 A1 | * | 8/2005 | Hacke et al. .................. 136/256 |
| 2005/0176164 A1 | | 8/2005 | Gee et al. |
| 2006/0102228 A1 | | 5/2006 | Sridharan et al. |
| 2006/0289055 A1 | | 12/2006 | Sridharan et al. |

OTHER PUBLICATIONS

ASM 5005 Aluminum Alloy specification, ASM 2002.*
Patent Abstracts of Japan, Publication No. 2005-079143, published Mar. 24, 2005, one page.
Patent Abstracts of Japan, Publication No. 2003-069056, published Mar. 7, 2003, one page.
Extended European Search Report, Application No. 06846462 dated Jun. 15, 2012, Applicant—Ferro Corporation, nine pages.
English Translation of JP 2005-079143, published Mar. 24, 2005, 20 pages.
English Translation of JP 2003-069056, published Mar. 7, 2003, 15 pages.

* cited by examiner

SOLAR CELL CONTACTS CONTAINING ALUMINUM AND AT LEAST ONE OF BORON, TITANIUM, NICKEL, TIN, SILVER, GALLIUM, ZINC, INDIUM AND COPPER

This application is a continuation in part of commonly owned copending U.S. application Ser. No. 11/384,838, filed Mar. 20, 2006, the disclosure of which is hereby incorporated by reference.

FIELD OF THE INVENTION

This invention relates to a conductive formulation made from aluminum particles, sources of other metals including at least one of boron, titanium, nickel, tin, silver, gallium, zinc, indium, and copper, inorganic additives, and glass frit dispersed in an organic system. The formulations are generally screen-printable and suitable for use in the fabrication of photovoltaic devices. These formulations can also be applied by other methods such as spraying, hot melt printing, ink jet printing, pad printing, micro-pen writing, and tape lamination techniques with suitable modifications of organics.

BACKGROUND

Solar cells are generally made of semiconductor materials, such as silicon (Si), which convert sunlight into useful electrical energy. A solar cell is in generally made of thin wafers of Si in which the required PN junction is formed by diffusing phosphorus (P) from a suitable phosphorus source into a p-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the n-side of silicon, and a coating of predominantly aluminum (Al) makes connection to the p-side of the silicon (back contact). Further, contacts known as silver rear contacts, made out of silver or silver-aluminum paste are printed and fired on the p-side of silicon to enable soldering of tabs that electrically connect one cell to the next in a solar cell module. These contacts are the electrical outlets from the PN junction to the outside load.

Conventional pastes for solar cell contacts contain lead frits. Inclusion of PbO in a glass component of a solar cell paste has the desirable effects of (a) lowering the firing temperature of paste compositions, (b) facilitating interaction with the silicon substrate and, upon firing, helping to form low resistance contacts with silicon. For these and other reasons PbO is a significant component in many conventional solar cell paste compositions. However, in light of environmental concerns, the use of PbO (as well as CdO), in paste compositions is now largely avoided whenever possible. Hence a need exists in the photovoltaic industry for lead-free and cadmium-free paste compositions, which afford desirable properties using lead-free and cadmium-free glasses in solar cell contact pastes.

Presently, a typical solar cell silicon wafer is about 200-300 microns thick, and the trend is toward thinner wafers. Because the wafer cost is about 60% of the cell fabrication cost, the industry is seeking ever-thinner wafers, approaching 150 microns. As the wafer thickness decreases, the tendency toward bowing (bending) of the cell due to the sintering stress increases, as well as bowing induced by the great difference in the thermal coefficients of expansion (TCE) between aluminum ($232 \times 10^{-7}/°$ C. @ 20-300° C.) and silicon ($26 \times 10^{-7}/°$ C. @ 20-300° C.).

Known methods of mitigating silicon wafer bowing include reduction of aluminum content during screen-printing that causes incomplete formation of Back Surface Field (BSF) layers and requires a higher firing temperature to achieve the same results. Chemical (acid) etching has been used to remove the Al—Si alloy that forms after firing the aluminum paste. This is just another step in the manufacturing process that leads to additional cost.

Another approach is to use additives to reduce the thermal expansion mismatch between the Al layer and the silicon wafer. However, a drawback is a reduction in back surface passivation quality and a concomitant reduction in solar cell performance. Partial covers, where only a portion of the back side of the wafer is coated with aluminum, have been used on the back surface to counteract bowing, which causes a reduction in cell performance.

Finally, another conventional way to reduce or eliminate bowing is cooling a finished solar cell from room temperature to ca. −50° C. for several seconds after firing. With the accompanying plastic deformation of the Al—Si paste matrix, bowing is largely eliminated, but this represents an additional process step, and there is a high danger of breakage from thermal stressing.

Hence a need exists in the photovoltaic industry for a low-bow, lead-free, high-performance Al paste that can create a sufficient aluminum back surface field in a solar cell contact, a method of making such a contact, and the Al paste from which such a BSF is formed.

SUMMARY OF THE INVENTION

The present invention provides an aluminum-based paste, which includes at least one of boron, titanium, nickel, tin, silver, gallium, zinc, indium, and copper, for application to a silicon solar cell having a p+ and n+ layer for the formation of a back-surface-field (BSF) and an emitter. The (B/Ti/Ni/Sn/Ag/Ga/Zn/In/Cu) doped aluminum contact formed by firing the paste eliminates or minimizes bowing of ultra thin silicon wafers, thereby improving reliability and electrical performance of solar cells made therewith, as measured by low series resistance ($R_S$) and high shunt resistance ($R_{sh}$) high efficiency (EFF) and high fill factor (FF), as well as reducing breakage. The term "(B/Ti/Ni/Sn/Ag/Ga/Zn/In/Cu)" means that at least one of the named metals is present, as a physical mixture or an alloy, if more than one.

Generally, the present invention includes a solar cell comprising a contact made from a mixture wherein, prior to firing, the mixture comprises an aluminum source, wherein the content of aluminum is about 50 to about 85 wt % of the mixture; a source of a metal selected from the group consisting of boron, titanium, nickel, tin, silver, gallium, zinc, indium, copper, mixtures thereof, and alloys thereof, wherein the total content of (B+Ti+Ni+Sn+Ag+Ga+Zn+In+Cu) is about 0.05 to about 40 wt % of the mixture; and about 0.1 to about 10 wt % of a glass component.

Another embodiment of the invention is a solar cell comprising a silicon wafer, aluminum, and a metal selected from the group consisting of boron, titanium, nickel, tin, silver, gallium, zinc, indium, copper, mixtures thereof, and alloys thereof, wherein the combined concentration of (Al+B+Ti+Ni+Sn+Ag+Ga+Zn+In+Cu) at a depth of about 0 to about 5 microns in the silicon wafer is about $10^{18}$ to about $10^{20}$ atoms per cubic centimeter ($cm^3$).

Yet another embodiment is a process for making a solar cell contact, comprising applying a mixture to a silicon wafer, and firing the mixture, wherein, prior to firing, the mixture comprises a. an aluminum source, wherein the content of aluminum is about 50 to about 85 wt % of the mixture,
b. a source of a metal selected from the group consisting of boron, nickel, tin, silver, gallium, zinc, indium, copper, combinations thereof, and alloys thereof, wherein the total content of (B+Ti+Ni+Sn+Ag+Ga+Zn+In +Cu) is about 0.05 to about 40 wt % of the mixture; and
c. about 0.1 to about 10 wt % of a glass component.

The compositions and methods of the present invention overcome the drawbacks of the prior art by optimizing interaction, bonding, and contact formation between back contact components—typically silicon and Al—using a properly formulated aluminum paste, which also includes at least one of boron, titanium, nickel, tin, silver, gallium, zinc, indium, copper, mixtures thereof, and alloys thereof, and a glass component. The foregoing is printed on a silicon substrate, and fired to fuse the glass, sinter the metal, and provide aluminum doping into the silicon wafer to a depth of several microns. Upon firing, for a back contact, a p+ layer is formed, which is overlaid by an Al—Si eutectic layer, and which in turn is overlaid by an aluminum layer which includes at least one of boron, titanium, nickel, tin, silver, gallium zinc, indium, copper, mixtures thereof, and alloys thereof. Each individually, or in any combination, boron, titanium, nickel, tin, silver, gallium zinc, indium, and copper, serve to promote sintering of aluminum, and its epitaxial co-crystallization with the silicon wafer thereby producing a contact having lower resistance between aluminum and the silicon wafer.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Figure 1A:
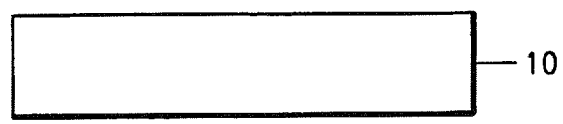
FIG. 1 is a process flow diagram illustrating the fabrication of a semiconductor device.
Reference numerals shown in FIG. 1 are explained below.
10: p-type silicon substrate
20: n-type diffusion layer
30: passivation layer/anti-reflective coating, which can be one of a silicon nitride film, titanium oxide film, or silicon oxide film
40: p+ layer (back surface field, BSF)
60: aluminum-(B/Ti/Ni/Sn/Ag/Ga/Zn/In/Cu) paste formed on backside
61: aluminum-(B/Ti/Ni/Sn/Ag/Ga/Zn/In/Cu) back electrode (obtained by firing back side aluminum-(B/Ti/Ni/Sn/Ag/Ga/Zn/In/Cu) paste)
70: silver or silver/aluminum paste formed on backside
71: silver or silver/aluminum back electrode (obtained by firing back side silver paste)
500: silver paste formed on front side according to the invention
501: silver front electrode according to the invention (formed by firing front side silver paste)

Broadly, the invention provides a solar cell comprising a contact. The contact is made from a mixture wherein prior to firing, the mixture comprises an aluminum source, wherein the content of aluminum is about 50 to about 85 wt % of the mixture, a source of a metal selected from the group consisting of boron, titanium, nickel, tin, silver, gallium, zinc, indium, copper, mixtures thereof, and alloys thereof, wherein the total content of (B+Ti+Ni+Sn+Ag+Ga+Zn+In+Cu) is about 0.05 to about 40 wt % of the mixture and about 0.1 to about 10 wt % of a glass component.

Another embodiment of the invention is a solar cell comprising a silicon wafer, aluminum, and a metal selected from the group consisting of boron, titanium, nickel, tin, silver, gallium, zinc, indium, copper, mixtures thereof, and alloys thereof, wherein the combined concentration of (Al+B+Ti+Ni+Sn+Ag+Ga+Zn+In+Cu) at a depth of about 0 to about 5 microns in the silicon wafer is about $10^{18}$ to about $10^{20}$ atoms per cubic centimeter ($cm^3$).

Yet another embodiment is a process for making a solar cell contact, comprising applying a mixture to a silicon wafer, and firing the mixture, wherein, prior to firing, the mixture comprises an aluminum source, wherein the content of aluminum is about 50 to about 85 wt % of the mixture, a source of a metal selected from the group consisting of boron, titanium, nickel, tin, silver, gallium, zinc, indium, and copper, mixtures thereof, and alloys thereof, wherein the total content of (B+Ti+Ni+Sn+Ag+Ga+Zn+In+Cu) is about 0.05 to about 40 wt % of the mixture; and about 0.1 to about 10 wt % of a glass component.

An aluminum back contact makes contact with both Si and the Ag/Al rear contact layer. In a back contact, the metal component preferably comprises aluminum and a metal selected from the group consisting of boron, titanium, nickel, tin, silver, gallium, zinc, indium, and copper, mixtures thereof, and alloys thereof, and the glass component may be one of several types. Bismuth based glasses and alkali titanium silicate glasses each have certain advantages over the prior art when used in a solar cell back contact.

Broadly, thick film pastes containing aluminum and glass frit are used to make back contacts for silicon-based solar cells to conduct to an external load the current generated by exposure to light. While the paste is generally applied by screen-printing, methods such as extrusion, pad printing, ink jet printing, non contact printing such as micro-pen writing, and hot melt printing may also be used. Further with suitable organics modifications the mixture of the present invention could be applied by tape lamination techniques. Solar cells with screen-printed front contacts are fired to relatively low temperatures (550° C. to 850° C. wafer temperature; furnace set temperatures of 650° C. to 1000° C.) to form a low resistance contact between the p-side of a boron doped silicon wafer and an aluminum based paste. Methods for making solar cells are also envisioned herein.

Aluminum- and glass-containing pastes are used to form low resistance ohmic contacts on the back side of the solar cell due to large area melting and re-solidification of Al doped ($p^+$) epitaxially grown Si layer which increases the solar cell performance due to improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage. More importantly, the open circuit voltage falls only slightly as the bulk resistivity increases. Therefore solar cell performance improves due to the formation of a substantial epitaxially re-grown $p^+$ layer in the Al back contact.

Leaded glasses are generally used in the pastes due to superior low melting characteristics and good wetting characteristics. For environmental reasons it is desirable to use lead-free and cadmium-free glasses. High-bismuth lead-free and cadmium-free glasses allow low firing temperatures in making contacts owing to their excellent flow characteristics relatively at low temperatures. Alkali-titanium-silicate glasses are another route to attain lower firing temperatures. While lead-glasses are often avoided for environmental reasons, they are sometimes used because they are the only route at present to certain properties, such as extremely low melting and wetting glasses. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver and/or silver-aluminum rear contacts on backside Si with optimal interaction with both Si and the back contact Al layer.

Broadly construed, the inventive pastes comprise aluminum, plus one or more metals selected from the group consisting of boron, titanium, nickel, tin, silver, gallium, zinc, indium, copper, mixtures thereof, and alloys thereof; and a glass component. Typical paste ingredients such as an organic vehicle are also included. Each ingredient is detailed hereinbelow.

Metal Component.

The major metal component of the back contact paste is aluminum. Aluminum is used because it forms a p+/p surface and provides a BSF for enhancing solar cell performance. The metal is typically applied in the form of a paste. The aluminum particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical aluminum particles or alternatively about 75 to about 90 wt % aluminum particles and about 1 to about 10 wt % aluminum flakes. Alternatively the paste may comprise about 75 to about 90 wt % aluminum flakes and about 1 to about 10 wt % of colloidal aluminum, or about 60 to about 95 wt % of aluminum powder or aluminum flakes and about 0.1 to about 20 wt % of colloidal aluminum. Suitable commercial examples of aluminum particles are available from Alcoa, Inc., Pittsburgh, Pa.; Ampal Inc., Flemington, N.J.; and ECKA Granulate GmbH & Co. KG, of Fürth, Germany.

Boron, Titanium, Nickel, Tin, Silver, Gallium, Zinc, Indium and Copper.

The paste mixtures herein include a source of at least one of boron, titanium, nickel, tin, silver, gallium, zinc, indium and copper to act as sintering aids and/or solidification modifying additives between Al and Si, such that the paste comprises about 0.05 to about 40 wt % of (B+Ti+Ni+Sn+Ag+Ga+Zn+In+Cu). Preferably this combined range of these nine elements (metals) is about 0.2 to about 20 wt % of the mixture, more preferably about 0.3 to about 10 wt % of the mixture. In a more preferred embodiment, at least two of boron, titanium, nickel, tin, silver, gallium, zinc, indium and copper are present, each in an amount of about 0.5 to about 10 wt % of the mixture. In a still more preferred embodiment, at least three of boron, titanium, nickel, tin, silver, gallium, zinc, indium and copper are present, each in an amount of about 0.5 to about 5 wt % of the mixture.

The source of any of the nine metals may be one or more of the respective metal powders, an alloy containing two or more of the respective metals, a salt including the respective metal, a colloidal suspension of the respective metal, an oxide of the respective metal, or a glass containing the respective metal.

Powders, salts, acids, bases, oxides, glasses, colloids, and organometallic compounds of the metals of interest may be used as their sources herein. Metal powders of boron, titanium, nickel, tin, silver, gallium, indium, copper, and zinc are widely available in a variety of particle sizes and distributions. Generally, the metal powder sizes are about 0.1 to about 40 microns, preferably up to about 10 microns. More preferably, the metal particle sizes are in line with the sizes of aluminum particles herein. Powders of metallic alloys in any combination of the foregoing metals with aluminum may also be used. For example, an aluminum-M alloy, where M is one or more of boron, titanium, nickel, tin, silver, gallium, zinc, indium and copper, may be used as the source of the metals, and may comprise about 60 to about 99.9 wt % of aluminum and about 0.1 to about 40 wt % of the other metals. In a preferred embodiment, an aluminum-M alloy containing about 0.1 to about 0.5 wt % M could be used for up to about 98 wt % of the paste mixture. Further the metals of interest can be introduced in the form of multi component alloy powders containing the metals of interest, such as TiBAl, TiCAl, AlTiBSr. In another preferred embodiment, an organometallic solution could be used to provide one or more of boron, titanium, nickel, tin, silver, gallium, zinc, indium and copper, wherein the total of such metals does not exceed about 5 wt % of the paste mixture.

Further, generally, the metals boron, titanium, nickel, tin, silver, gallium, zinc, indium and copper may be provided in the form of ionic salts, such as halides, carbonates, hydroxides, phosphates, nitrates, and sulfates, of the metal of interest or in the form of borides, carbides, nitrides, silicides and aluminides. Acids or bases containing the metal of interest may also be used, for example boric acid. Colloidal suspensions containing one or more of the nine metals may be used to form the pastes herein. Organometallic compounds of any of the metals may also be used, including, without limitation, resinates, acetates, formates, carboxylates, phthalates, isophthalates, terephthalates, fumarates, salicylates, tartrates, gluconates, ethoxides, or chelates such as those with ethylenediamine (en) or ethylenediamine tetraacetic acid (EDTA). Other appropriate powders, salts, colloids, and organometallics containing at least one of the nine metals will be readily apparent to those skilled in the art.

Paste Glasses.

The pastes comprise about 0.1 to about 10 wt %, preferably 0.2 to about 5 wt % of a glass component. The glass component comprises, prior to firing, one or more glass compositions. Each glass composition comprises oxide frits including, in one embodiment, $Bi_2O_3$, $B_2O_3$ and $SiO_2$. In another embodiment, the glass composition comprises an alkali oxide, $TiO_2$, and $SiO_2$. In a third embodiment, the glass composition comprises PbO. In particular, in various embodiments of the present invention, glass compositions for back contacts may be found in Tables 1-3. The entry "20 trivalent oxides" means one or more trivalent oxides of an element selected from the group consisting of Al, Ga, In, Sc, Y, and an element having an atomic number of from 57 to 71. In formulating the pastes, the glass frits typically have particle sizes of about 0.5 to about 10 microns, although other particle sizes may be used as known in the art.

It is preferable that the glass powder used in the paste formulation has the glass transition temperature (Tg) in the range of 300° C. to 700° C., preferably in the 400° C. to 550° C. range.

Looking to Tables 1-3, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, or about 1:5 to about 5:1. In certain embodiments, the glass component contains no lead or oxides of lead, and no cadmium or oxides of cadmium. However, in certain embodiments where the properties of PbO and/or CdO cannot be duplicated, such embodiments advantageously comprise PbO and/or CdO. Specific lead-containing embodiments include the following, so long as the content of the following oxides does not exceed the indicated amount in mol % PbO (65%), $SiO_2$ (40%), $B_2O_3$ (30%), ZnO (25%); trivalent oxides of elements selected from the group consisting of Al, Ga, In, Sc, Y, La (25%), and ($TiO_2+ZrO_2$) (5%), provided that the total of ($B_2O_3+SiO_2$) does not exceed 45%. The lead-containing glass components may further comprise about 0.1 to about 12 mol % $Al_2O_3$. An entry such as "$Li_2O+Na_2O+K_2O$" means that the total content of $Li_2O$ and $Na_2O$ and $K_2O$ falls within the specified ranges. In each range having a lower bound of zero, a preferred embodiment thereof is the same range having a lower bound of 0.1%.

TABLE 1

Oxide frit ingredients for bismuth-based back contact glasses in mole percent.

| Ingredient | Glass Composition | | |
|---|---|---|---|
| | I | II | III |
| $Bi_2O_3$ | 5-85 | 10-75 | 12-50 |
| $B_2O_3$ + $SiO_2$ | 5-75 | 15-75 | 34-71 |
| ZnO | 0-55 | 0-20 | 0-12 |
| $Li_2O$ + $Na_2O$ + $K_2O$ | 0-40 | 5-30 | 10-30 |
| 20 trivalent oxides | 0-25 | 0-20 | 3-10 |
| $Sb_2O_5$ + $Nb_2O_5$ | 0-40 | 0-30 | 0-20 |
| $TiO_2$ + $ZrO_2$ | 0-20 | 0-10 | 1-6 |

TABLE 2

Oxide frit ingredients for alkali-titanium-silicate back contact glasses in mole percent.

| Ingredient | Glass Composition | | |
|---|---|---|---|
| | IV | V | VI |
| $Li_2O$ + $Na_2O$ + $K_2O$ | 5-55 | 15-50 | 30-40 |
| $TiO_2$ | 2-26 | 10-26 | 15-22 |
| $B_2O_3$ + $SiO_2$ | 5-75 | 25-70 | 30-52 |
| $V_2O_5$ + $Sb_2O_5$ + $P_2O_5$ | 0-30 | 0.25-25 | 5-25 |
| MgO + CaO + BaO + SrO | 0-20 | 0-15 | 0-10 |
| F | 0-20 | 0-15 | 5-13 |

TABLE 3

Oxide frit ingredients for lead based back contact glasses in mole percent.

| Ingredient | Glass Composition | | |
|---|---|---|---|
| | VII | VIII | IX |
| PbO | 15-75 | 25-66 | 50-65 |
| $B_2O_3$ + $SiO_2$ | 5-75 | 20-55 | 24-45 |
| ZnO | 0-55 | 0.1-35 | 0.1-25 |
| $Li_2O$ + $Na_2O$ + $K_2O$ | 0-40 | 0-30 | 0-10 |
| $TiO_2$ + $ZrO_2$ | 0-20 | 0-10 | 0.1-5 |
| 20 trivalent oxides | 0-25 | 0.1-20 | 1-10 |

In one embodiment the glass component comprises: about 12 to about 50 mole % $Bi_2O_3$; about 25 to about 65 mole % $SiO_2$; about 5 to about 15 mole % $B_2O_3$; about 4 to about 26 mole % $K_2O$; $TiO_2$, wherein the content of $TiO_2$ does not exceed about 10 mole %; and an oxide of an element selected from the group Li, Na, K, Rb and combinations thereof, provided the combined total of such oxides does not exceed about 40 mol %, preferably at least about 1 mol % of the combination. In an embodiment containing alkali oxides the glass component comprises about 1 to about 15 mole % $Li_2O$, about 8 to about 25 mole % $Na_2O$, about 3 to about 25 mole % $K_2O$, about 8 to about 22 mole % $TiO_2$, about 25 to about 50 mole % $SiO_2$, about 2 to about 18 mole % $V_2O_5$, and about 0.25 to about 25 mole % $P_2O_5$, and may further comprise fluorine, not to exceed about 20 mol %.

In another embodiment, the composition may comprise one or more of the following, so long as the content of the following oxides does not exceed the indicated amount in mol % $Li_2O$ (25%), $Na_2O$ (25%), $K_2O$ (25%), $Rb_2O$, (25%), $TiO_2$ (22%), $SiO_2$ (60%), $V_2O_5$ (18%), the sum of ($Sb_2O_5+V_2O_5+P_2O_5$) (25%), and F (15%)

Vehicle.

The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Although a variety of weight ratios of the solids portion to the organics portion are possible, one embodiment includes a weight ratio of the solids portion to the organics portion from about 20:1 to about 1:20, or about 15:1 to about 1:15, or about 10:1 to about 1:10.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum, or boron, to modify the contact. N-Diffusol® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

Other Additives.

Other inorganic additives may be added to the paste to the extent of about 1 to about 30 wt %, preferably about 2 to about 25 wt % and more preferably about 5 to about 20 wt % based on the weight of the paste prior to firing. Other additives such as clays, fine silicon, silica, carbon powder, or combinations thereof can be added to control the reactivity of the aluminum and boron with silicon. Common clays which have been calcined are suitable. Fine particles of low melting metal additives (i.e., elemental metallic additives as distinct from metal oxides) such as Pb, Bi, and Sb, and alloys of each with each other as well as with other low melting elements such as In, Sn, and Ga, and as well as their alloys with Cu, Ag, Zn, can be added to provide a contact at a lower firing temperature, or to widen the firing window.

A mixture of (a) glasses or a mixture of (b) crystalline additives and glasses or a mixture of (c) one or more crystalline additives can be used to formulate a glass component in the desired compositional range. Exemplary crystalline additives include bismuth silicates, lead silicates and cordierites (magnesium alumino silicates). The goal is to reduce bowing and improve the solar cell electrical performance. For example, oxides such as $Bi_2O_3$, $Sb_2O_5$, $In_2O_3$, $SiO_2$, $ZrO_2$, $Al_2O_3$, $B_2O_3$, NiO, $Ni_2O_3$, SnO, $Sn_2O_3$, GaO, $Ga_2O_3$, ZnO, CuO, $Cu_2O$, MgO, SrO, $Fe_2O_3$, and reaction products thereof and combinations thereof may be added to the glass component to adjust contact properties. However, the total amounts of the above oxides must fall within the ranges specified for various embodiments disclosed elsewhere herein.

Paste Preparation.

The paste according to the present invention may be conveniently prepared on a planetary mixer. The amount and type of carriers utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a planetary mixer, to form a suspension, resulting in a composition for which the viscosity will be in the range of about 20 to about 300 kcps, preferably about 20 to about 150 kcps, more preferably about 25 to about 125 kcps at a shear rate of 9.6 $sec^{-1}$ as determined on a Brookfield viscometer HBT, spindle 14, measured at 25° C.

The pastes herein can be used to form a $p^+$ BSF several microns thick with an active peak doping concentration of about $10^{19}$ to about $10^{20}$ atoms per $cm^3$; that is, one or two orders of magnitude higher than is achievable with conventional Al paste (e.g., on the order of $10^{18}$ atoms per $cm^3$). The Al paste including at least one of boron, titanium, tin, gallium, and indium herein is believed to use the higher solid solubility of each of these elements in silicon to increase the dissolution of Al into Si. Similarly the Al paste including at least one of titanium, nickel, silver, zinc, and copper herein is believed to use the higher solubility of aluminum in these metals to improve both the sintering of aluminum particles and/or to increase the dissolution of Al in Si. The presence of at least one of boron, titanium, nickel, tin, silver, gallium, zinc, indium and copper assists the sintering of aluminum and improves the contact between back-side aluminum with the silicon wafer. Therefore, the use of Al—(B/Ti/Ni/Sn/Ag/Ga/Zn/In/Cu) paste makes it possible to deposit thinner paste layers to reduce bowing, yet also provide good BSF formation, and exploit the gettering properties of aluminum to improve minority carrier lifetime in solar cells without losing good ohmic contact properties of the Al—Si layer.

Printing and Firing of the Pastes.

The inventive method of making a solar cell back contact comprises: (1) applying an Al—(B/Ti/Ni/Sn/Ag/Ga/Zn/In/Cu) containing paste to the p-side of a silicon wafer on which back silver back contact paste is already applied and dried, (2) drying the paste, and (3) applying the front contact silver paste, and (4) co-firing the front contact, silver rear contact, and back contact paste. The solar cell printed with silver rear contact Ag-paste, Al-back contact paste, and Ag-front contact paste is fired at a suitable temperature, such as about 650° C. to about 950° C. furnace set temperature; or about 550° C. to about 850° C. wafer temperature. Also during firing as the wafer temperature rises above the various eutectic or peritectic temperatures of Al with each of the other metals (Al/B: 660° C., Al/Ti: 665° C., Al/Ni: 640° C., Al/Si: 577° C., Al/Sn: 228° C., Al/Ag: 567° C., Al/Ga: 27° C., Al/Zn: 381° C., A/In: 639° C., and Al/Cu: 548° C.), the back contact Al and (B/Ti/Ni/Sn/Ag/Ga/Zn/In/Cu) dissolves Si from the substrate and a liquid Al—(B/Ti/Ni/Sn/Ag/Ga/Zn/In/Cu)—Si layer is formed. This Al—(B/Ti/Ni/Sn/Ag/Ga/Zn/In/Cu)—Si liquid continues to dissolve substrate Si during further heating to peak temperature. During the cool down period, Si precipitates back from the Al—(B/Ti/Ni/Sn/Ag/Ga/Zn/In/Cu)—Si melt. This precipitating Si grows as an epitaxial layer on the underlying Si substrate and forms a p+ layer. When the cooling melt reaches the lowest eutectic temperature, the remaining liquid freezes as an Al—Si-rich eutectic layer. A continuous p+ layer is believed to provide an efficient back surface field (BSF), which in turn increases the solar cell performance. The glass in the back contact should optimally interact with at least one of Al and Si without unduly affecting the formation of an efficient BSF layer.

Method of Front and Back Contact Production.

Referring now to FIGS. 1A-1E, a solar cell front contact according to the present invention generally can be produced by applying any silver-based paste to a solar grade Si wafer. In particular, FIG. 1A shows a step in which a substrate of single-crystal silicon or multicrystalline silicon is provided typically, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally may be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This gives the substrate, 10, depicted with exaggerated thickness dimensions, as a typical silicon wafer is ca. 200 microns thick.

Figure 1B:
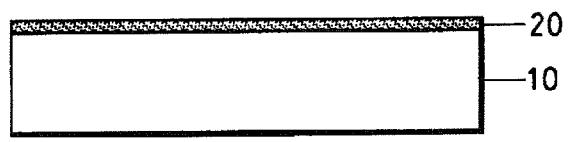

Referring to FIG. 1B, when the substrate used is a p-type substrate, an n-type layer 20 is formed to create a p-n junction. A phosphorus diffusion layer is supplied in any of a variety of suitable forms, including phosphorus oxychloride ($POCl_3$), and other phosphorus sources including organophosphorus compounds, and others disclosed herein. The phosphorus source may be selectively applied to only one side of the silicon wafer. The depth of the diffusion layer can be varied by controlling the diffusion temperature and time, is generally about 0.3 to 0.5 microns, and has a sheet resistivity on the order of about 40 to about 100 ohms per square. The phosphorus source may include phosphorus-containing liquid coating material such as phosphosilicate glass (PSG) is applied onto only one surface of the substrate by a process, such as spin coating, and diffusion is effected by annealing under suitable conditions.

Figure 1C:
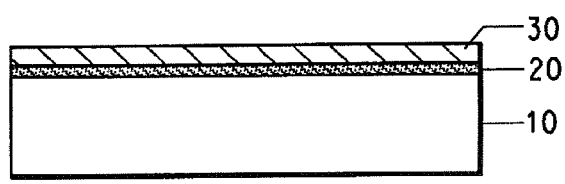

Next, in FIG. 1C, an antireflective coating (ARC)/passivating film 30, which may be $SiN_x$, $TiO_2$ or $SiO_2$, is formed on the above-described n-type diffusion layer, 20. Silicon nitride film is sometimes expressed as $SiN_x$:H to emphasize passivation by hydrogen. The ARC 30 reduces the surface reflectance of the solar cell to incident light, increasing the electrical current generated. The thickness of ARC 30 depends on its refractive index, although a thickness of about 700 to 900 Å is suitable for a refractive index of about 1.9 to 2.0. The ARC may be formed by a variety of procedures including low-pressure CVD, plasma CVD, or thermal CVD. When thermal CVD is used to form a $SiN_x$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen-$Si_3N_4$. Other methods of forming an ARC are known in the art.

Figure 1D:
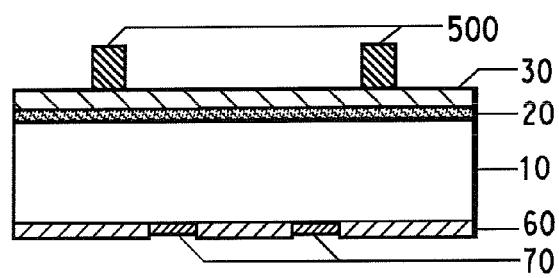

As shown in FIG. 1D, a silver paste 500 for the front electrode is screen printed then dried over the silicon nitride film 30. In addition, a back side silver or silver/aluminum paste 70 and an Al—(B/Ti/Ni/Sn/Ag/Ga/Zn/In/Cu) paste 60 are then screen printed and successively dried on the backside of the substrate. The Al—(B/Ti/Ni/Sn/Ag/Ga/Zn/In/Cu) paste may include one or more glass frits from Tables 1, 2, or 3. Firing is then carried out in an infrared belt furnace at a temperature range of approximately 700° C. to 975° C. for a period of from about a minute to about several minutes.

Figure 1E:
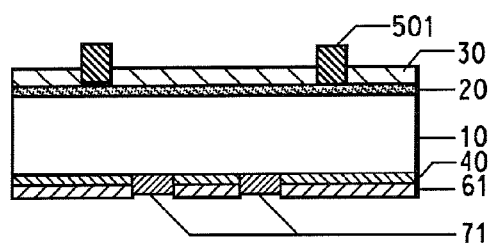

Consequently, as shown in FIG. 1E, aluminum from the Al—(B/Ti/Ni/Sn/Ag/Ga/Zn/In/Cu) paste melts and reacts with the silicon substrate 10 during firing, then solidifies forming a p+ layer, 40, containing a high concentration of aluminum dopant. This layer is generally called the back surface field (BSF) layer, and helps to improve the energy conversion efficiency of the solar cell.

The Al—(B/Ti/Ni/Sn/Ag/Ga/Zn/In/Cu) paste is transformed by firing from a dried state 60 to an aluminum back contact 61 including at least one of (B/Ti/Ni/Sn/Ag/Ga/Zn/In/Cu). The backside silver or silver/aluminum paste 70 is fired at the same time, becoming a silver or silver/aluminum back contact 71. During firing, the boundary between the back side Al—(B/Ti/Ni/Sn/Ag/Ga/Zn/In/Cu) and the back side silver or silver/aluminum assumes an alloy state, and is connected electrically as well. The back contact is largely covered with the Al—(B/Ti/Ni/Sn/Ag/Ga/Zn/In/Cu) paste, to a wet thickness of about 30 to 50 microns, owing in part to the need to form a thicker p+ layer 40. The back side silver paste areas are used for tab attachment during module fabrication. In addition, the front electrode-forming silver paste 500 sinters and penetrates through (i.e., fires through) the silicon nitride film 30 during firing, and is thereby able to electrically contact the n-type layer 20. This fired through state is apparent in layer 501 of FIG. 1E.

Nitrogen ($N_2$) or another inert atmosphere may be used for firing if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes at peak temperatures are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of about 650° C. to about 1000° C.

EXAMPLES

Polycrystalline silicon wafers, used in the following examples were 243 cm$^2$ in area and about 160 microns thick. These wafers were coated with a silicon nitride antireflective coating on the n-side of Si. The sheet resistivity of these wafers was about 1 Ω-cm.

Exemplary glasses of the invention are presented in Table 4.

TABLE 4

Exemplary Glass Compositions

| | Glass | | |
| --- | --- | --- | --- |
| Mole % | A | B | C |
| $Bi_2O_3$ | 35.8 | 12.2 | |
| $SiO_2$ | 35.5 | 62.6 | 37.0 |
| $B_2O_3$ | 7.2 | 8.0 | |
| $TiO_2$ | | 5.0 | 18.2 |
| $V_2O_5$ | | | 8.8 |
| $Li_2O$ | | 6.1 | 5.4 |
| $Na_2O$ | | | 20.9 |
| $K_2O$ | 21.5 | 6.1 | 8.8 |
| $P_2O_5$ | | | 0.9 |

Exemplary Al—(B/Ti/Ni/Sn/Ag/Ga/Zn/In/Cu) formulations in Table 5 were made with the glasses described in Table 4 plus commonly used metal powders with particle sizes less than 10 microns, including various combinations of Ni, Sn, and Zn as appropriate, Cabosil®, an organo boron solution, Triethylborane, an organic titanium solution, titanium ethoxide, Anti-Terra® 204, organic vehicles and Texanol®. The metal particles are commercially available from Micron Metals, Inc., Bergenfield, N.J. The clay is $Na_{0.3}(Mg,Li)_3Si_4O_{10}(OH)_2$ (hectorite), which is calcined to drive off water, then pulverized (ball-milled) using conventional means, and wetted at a ratio of 40 wt % calcined clay, 59 wt % terpineol, and 1 wt % Anti-Terra® 204. Anti-Terra® 204 is a wetting agent commercially available from BYK-Chemie GmbH, Wesel, Germany. Cabosil® is fumed silica, commercially available from Cabot Corporation, Billerica Mass. Triethylborane and titanium ethoxide are available from Sigma-Aldrich, St. Louis, Mo. 63178, USA. Vehicle 205 and Vehicle 450 are commercially available from Ferro Corporation, Cleveland, Ohio, USA. Terpineol is commercially available from Mallinckrodt Baker, Inc., Phillipsburg, N.J. 08865, USA. Texanol® is commercially available from Alfa Aesar, Ward Hill, Mass. 01835, USA.

TABLE 5

Exemplary Aluminum-Paste Formulations (with various combinations of Ni, Sn, and Zn) in wt %

| Chemical | Prior art Al powder CN53-101 | Paste A CN53-200 (Al—B) | Paste B (Al—B—Ni) | Paste C (Al—B—Sn) | Paste D (Al—Zn) | Paste E (Al—B—Ni—Sn) |
|---|---|---|---|---|---|---|
| Al Powder | 76.29 | 71.96 | | | | |
| CN53-200 | | | 99.5 | 99.5 | 99.5 | |
| Vehicle 205 | 6.8 | 6.17 | | | | |
| Vehicle 450 | 4.5 | 5.14 | | | | |
| Terpineol | | 5.14 | | | | |
| Texanol ® | 4.43 | 6.65 | | | | |
| Anti-Terra ® 204 | 1 | 1.13 | | | | |
| Cabosil ® EH5 | 0.4 | 0.34 | | | | |
| Triethylborane | | 1.53 | | | | |
| Titanium ethoxide | | 1.44 | | | | |
| Glass A | 0.8 | | | | | |
| Glass B | 0.8 | | | | | |
| Glass C | | 0.5 | | | | |
| Clay | 4.98 | | | | | |
| ENP400 Ni Powder | | | 0.5 | | | |
| Paste A | | | | | | 99.5 |
| Sn101 Tin Powder | | | | 0.5 | | 0.5 |
| Zn101 powder | | | | | 0.5 | |
| Total | 100 | 100 | 100 | 100 | 100 | 100 |

TABLE 6

Electrical and bowing data of Paste formulations of Table 5.

| ID | Product | Bowing (mm) | Jsc (mA/cm$^2$) | Voc (mV) | FF | EFF |
|---|---|---|---|---|---|---|
| Paste A | Al—B | 0.95 | 33.66 | 607.0 | 75.0 | 15.27 |
| Paste B | Al—B—Ni | 1.42 | 33.14 | 603.0 | 75.0 | 14.90 |
| Paste C | Al—B—Sn | 1.30 | 33.26 | 605.3 | 75.2 | 15.13 |
| Paste D | Al—B—Zn | 1.61 | 32.58 | 601.0 | 75.7 | 14.82 |
| Paste E | Al—B—Sn | 1.20 | 33.15 | 605.0 | 75.0 | 14.98 |
| CN53-101 | Prior art Al | 1.81 | 33.61 | 601.0 | 74.0 | 14.95 |

The exemplary Al back contact pastes containing various combinations of Ni, Sn, and Zn in Table 6 were printed on 160 micron thick silicon solar cells having an area of 243 cm$^2$, which were pre-coated with the back side silver/aluminum paste CN33-451, available from Ferro Corporation, Cleveland, Ohio. Both pastes were printed using 200 mesh screen. After drying the back contact paste, the front contact paste CN33-455, available from Ferro Corporation, Cleveland, Ohio, was printed using a 280 mesh screen with 100 micron openings for finger lines and with about 2.8 mm spacing between the lines. The printed wafers were co-fired using a 3-zone infrared (IR) belt furnace with a belt speed of about 3 meters (120") per minute, with temperature settings of 780° C., 830° C., and 920° C., respectively. The zones were 7", 16", and 7" long, respectively. The fired finger width for the front contact Ag lines was about 120 to 170 microns and the fired thickness was about 10 to 15 microns. A prior art "low bow" aluminum paste (commercially available Ferro CN53-101) was fired side by side with the aluminum-boron pastes (including Ni, Sn, or Zn) according to the invention. About 1.7 grams of the respective pastes were printed onto the silicon wafers.

Electrical performance of some of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 6, which shows typical solar cell electrical properties and bowing for similar wafers for comparison of a prior art low bow Al paste and pastes of the invention.

In Table 6, Jsc means current density; Voc means open circuit voltage measured at zero output current; Efficiency (EFF) and Fill Factor (FF) are known in the art. Bowing is the measure of the wafer bow in mm using 160 micron wafers having an area of 243 cm$^2$.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A solar cell comprising a contact made from a mixture wherein, prior to firing, the mixture comprises:
   a. an aluminum source, wherein the content of aluminum is about 50 to about 85 wt % of the mixture,
   b. sources of at least two additional metals selected from the group consisting of boron, titanium, nickel, tin, silver, gallium, zinc, indium, copper, mixtures thereof, and alloys thereof, wherein each of the two additional metals is present in an amount of about 0.3 to about 10 wt % of the mixture; and
   c. about 0.1 to about 10 wt % of a lead-free and cadmium-free glass component, wherein the glass component consists essentially of:
      (i) about 1 to about 15 mole % LhO,
      (ii) about 8 to about 25 mole % Na20,
      (iii) about 3 to about 25 mole % K20,
      (iv) about 8 to about 22 mole % Ti02,
      (v) about 25 to about 50 mole % Si02,
      (vi) about 2 to about 18 mole % V 205, and
      (vii) about 0.25 to about 5 mole % P205.

2. The solar cell of claim 1, wherein the aluminum source is selected from the group consisting of aluminum metal powder, an aluminum alloy, an aluminum salt, organometallic aluminum, colloidal aluminum, an oxide of aluminum, and aluminum-containing glass.

3. The solar cell of claim 1, wherein the mixture includes boron, and the boron source is selected from the group consisting of boron metal powder, a boron alloy, a boron salt, boric acid, organometallic boron, colloidal boron, an oxide of boron, and boron-containing glass.

4. The solar cell of claim 3, wherein the mixture includes boron, and the boron source is an alloy or mixture comprising boron and titanium.

5. The solar cell of claim 4, wherein the mixture includes boron and the boron source further comprises at least one of aluminum and strontium.

6. The solar cell of claim 1, wherein the mixture includes titanium, and the titanium source is selected from the group consisting of titanium metal powder, a titanium alloy, a titanium salt, organometallic titanium, colloidal titanium, an oxide of titanium, and titanium containing glass.

7. The solar cell of claim 1, wherein the mixture includes copper, and the copper source is selected from the group consisting of copper metal powder, a copper alloy, a copper salt, a copper silicide, a copper aluminide, organometallic copper, colloidal copper, an oxide of copper, and copper-containing glass.

8. The solar cell of claim 7, wherein the copper source is a copper-aluminum alloy including 0.1-0.5 wt % copper.

9. The solar cell of claim 1, wherein the mixture includes nickel, and the nickel source is selected from the group consisting of nickel metal powder, a nickel alloy, a nickel salt, a nickel silicide, a nickel aluminide, organometallic nickel, colloidal nickel, an oxide of nickel, and nickel-containing glass.

10. The solar cell of claim 1, wherein the mixture includes tin, and the tin source is selected from the group consisting of tin metal powder, a tin alloy, a tin salt, organometallic tin, colloidal tin, an oxide of tin, and tin-containing glass.

11. The solar cell of claim 1, wherein the mixture includes silver, and the silver source is selected from the group consisting of silver metal powder, a silver alloy, a silver salt, organometallic silver, colloidal silver, an oxide of silver, and silver-containing glass.

12. The solar cell of claim 1 wherein the mixture includes zinc, and the zinc source is selected from the group consisting of zinc metal powder, a zinc alloy, a zinc salt, organometallic zinc, colloidal zinc, an oxide of zinc, and zinc-containing glass.

13. The solar cell of claim 1, wherein the combined concentration of (Al+B+Ti+Ni+Sn+Ag+Ga+Zn+In+Cu) at a depth of about 0 to about 5 microns in the silicon wafer is about $10^{18}$ to about $10^{20}$ atoms per cubic centimeter.

14. A solar panel comprising the solar cell of claim 1.

15. The solar cell of claim 1, wherein sources of at least three metals selected from the group consisting of boron, titanium, nickel, tin, silver, gallium, zinc, indium, copper, mixtures thereof, and alloys thereof, are present, wherein each of the three metals is present in an amount of about 0.3 to about 10 wt % of the mixture.

* * * * *